United States Patent [19]
Donovan et al.

[11] 4,125,649
[45] Nov. 14, 1978

[54] PRE-ETCH CONDITIONING OF POLYSULFONE AND OTHER POLYMERS FOR ELECTROLESS PLATING

[75] Inventors: Lawrence P. Donovan, Temple City; Eileen Maguire; Leon A. Kadison, both of Pasadena, all of Calif.

[73] Assignee: Crown City Plating, El Monte, Calif.

[21] Appl. No.: 581,038

[22] Filed: May 27, 1975

[51] Int. Cl.$^2$ .............................................. B05D 3/10
[52] U.S. Cl. .................................. 427/307; 156/625; 156/628; 156/668; 204/30; 204/32 R; 252/79.1; 427/306; 427/444
[58] Field of Search ............... 427/306, 307, 444, 304, 427/305; 156/2, 625, 628, 668; 204/30, 32 R; 252/79.1

[56] References Cited

U.S. PATENT DOCUMENTS

| | | | |
|---|---|---|---|
| 3,574,070 | 4/1971 | Schely | 427/307 |
| 3,600,217 | 8/1971 | Eichhom et al. | 427/307 |
| 3,607,354 | 9/1971 | Krogh et al. | 156/2 |
| 3,702,286 | 11/1972 | Ichiki et al. | 427/307 |
| 3,740,252 | 6/1973 | Chaikin | 427/307 |
| 3,902,950 | 9/1975 | Tung | 427/307 |

OTHER PUBLICATIONS

Brardrup et al., *Polymer Handbook*, Interscience Publisher's, 1966, IV-185, pp. 185, 192, 193, 200, 204, 207, 214, 216, 219, 222, 223, 227, 228.
*The Condensed Chemical Dictionary*, 6th Ed., Rheinhold, 1964, p. 261.
*The Condensed Chemical Dictionary*, 6th Ed., N.Y., Rheinhold, pp. 263, 264, 366, 363, 1160.
Hackis Chemical Dictionary, 3rd Ed., Blakiston, Phil., p. 8.

*Primary Examiner*—Ronald H. Smith
*Assistant Examiner*—Janyce A. Bell
*Attorney, Agent, or Firm*—Christie, Parker & Hale

[57] ABSTRACT

Mixtures of water with water soluble and/or miscible halogenated compounds are used to pre-etch polysulfone and other polymers such as polyesters and polycarbonates to induce or improve adhesion of metals deposited by electroless plating processes.

18 Claims, No Drawings

PRE-ETCH CONDITIONING OF POLYSULFONE AND OTHER POLYMERS FOR ELECTROLESS PLATING

BACKGROUND OF THE INVENTION

The present invention relates to electroless plating of polysulfone and other polymers and to improving coverage and bond strength between an electrolessly deposited metal coating and the polymer substrate.

A considerable demand exists for metal plated non-conductive articles, particularly plastic articles. In the finished product the desirable characteristics of the plastic and metal are combined to offer thereby the technical and aesthetic advantages of each. For instance, superior mechanical properties of polysulfone resins may be aesthetically enhanced by a metal coating. Although the polysulfones, like most polymers, are electrically non-conductive, they should be readily platable using an "electroless plating" operation. This operation is today typically accomplished by conditioning the surface for plating by inorganic etching with a strong oxidizing acid or base, seeding the surface by contact with a noble metal salt solution, e.g., a palladium chloride solution, then immersing the seeded surface in an autocatalytic electroless solution where an initial coating of a conductive metal, e.g., copper or nickel, is established by chemical deposition. The metal coating formed acts as a buss which allows a thicker metal coating to be built up electrolytically.

Adhesion between the metal plate and a polymeric substrate is, however, dependent on the strength of the resin-metal bond.

It has been proposed to improve adhesion by organically pre-etching the surface prior to etching with the inorganic etch. The pre-etch systems have varied widely depending on the nature of the polymer.

Among the organic compounds which have been suggested by the art for the pre-etch treatment of polymeric surfaces have been chlorinated hydrocarbons. For instance, in U.S. Pat. No. 3,445,350 to Klinger et al, several chlorinated hydrocarbons were proposed as "ABS solvents". The chlorinated compounds employed were used in an undiluted state or diluted with a hydrocarbon. The use of chloroform for certain blended polymers is disclosed in U.S. Pat. No. 3,466,232; methylene chloride for polycarbonates in U.S. Pat. No. 3,471,376; emulsified or hydrocarbon diluted halogenated compounds for styrene homopolymers and interpolymers in U.S. Pat. No. 3,533,828; and various emulsions keyed to particular polymers in U.S. Pat. No. 3,570,070.

The use of water insoluble chlorinated compounds for the treatment of polymer surfaces have several inherent deficiencies. Most are high in cost and many hazardous if not toxic. If used without dilution, their continuing evaporation losses is, in itself, an expense. In addition, ventilation equipment uncommon to commercial plating operations have to be installed for personnel safety. Dilution with hydrocarbons does not diminish this problem. Emulsification adds a degree of compatibility with plating operations. Emulsions, however, are difficult to maintain particularly in light of the materials "dragged" into the pre-etch and introduced by errosion of the polymer surface. These materials tend to break emulsions presenting a continuing relatively unpredictable maintenance problem. Emulsion breakdown cannot be readily predicted, and once broken, reconstitution is difficult if not impossible.

SUMMARY OF THE INVENTION

It has now been found that the adhesion of electrolessly deposited metal coatings for polymeric substrates, especially polysulfone, can be induced or markedly improved by preceding the inorganic etch with a strong base or oxidizing acid with contact of the substrate with an aqueous pre-etch solution comprising at least one water compatible halogenated compound containing functional

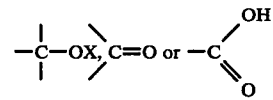

group wherein X is hydrogen or an alkali metal and in which a halogen is separated from the group by no more than three carbon atoms. Aliphatic halogenated compounds in which the halogen is separated from the functional group by no more than two carbon atoms are preferred. The preferred aliphatic halogenated compounds are polyhalogenated containing at least two halogen atoms and from 1 to about 6 carbon atoms.

Chlorinated compounds are preferred. The particularly preferred aliphatic chlorinated compounds are dichloropropanol, dichloroacetone, dichloroacetic acid and trichloroacetic acid. The alkali metal salts of halogenated phenols may also be used. Dichloropropanol is especially preferred for polysulfones particularly filled polysulfones.

Residence time in the pre-etch is sufficient to modify the surface to enable etching in a strong base or oxidizing acid and surface absorption of noble metals to permit electroless plating. Contact times for this purpose will, depending on the nature of the resin and temperature, range from 0.5 to about 10 minutes preferably from about 1 to 3 minutes. Temperatures generally range from 80° F. to about 160° F. For polysulfone, the optimum temperature range is from about 130° to 150° F., preferably 135° to 145° F. Temperature, in any instance, should not exceed the melting point of the polymer.

The water compatible halogenated compounds are water soluble or water miscible. Concentrations will vary depending on the compound selected and will range from about 5 to about 70% by weight.

While especially adapted for surface treatment of polysulfones, polycarbonates and polyesters, the pre-etch compositions of this invention may also be used to modify the surface of other polymers and resins such as polystyrene, styrene-acrylonitrile, acrylonitrile-styrene-butadiene, and the like.

In addition to imparting adhesion to and enabling uniform coating of polysulfones, polycarbonates and polyesters, the aqueous based pre-etch compositions of this invention offer material savings in processing costs and reduced hazards.

DESCRIPTION

According to the present invention, the bond strength of metals electrolessly deposited on polymeric substrates is remarkably induced or improved by preceding etching with inorganic etch, i.e. a strong base or oxidizing acid with the pre-etch compositions which are solutions of water compatible halogenated compounds in an aqueous media. The preferred halogenated compounds are chlorinated compounds.

The polymers whose adhesion to electrolessly deposited metals can be achieved are the polysulfones, polycarbonates and polyesters. While adhesion can, in accordance with the invention, be established and coating uniform for both filled and unfilled polysulfone, polycarbonate and polyester resins achieved, surface appearance is maximized for filled resins.

Bond strength to other polymers, both filled and unfilled, such as polystyrene, styrene-acrylonitrile, acrylonitrile-butadiene-styrene, and the like can also be induced or materially improved.

The pre-etch compositions used for conditioning resin surfaces for electroless plating comprise at least one halogenated compound containing a functional

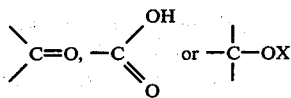

group wherein X is hydrogen or an alkali metal and in which a halogen is separated from the group by no more than three carbon atoms. The halogenated compounds contain from 1 to about 6 carbon atoms and preferably are polyhalogenated containing at least two bound halogen atoms. The water compatible halogenated compounds may be water soluble or water miscible, and aliphatic or aromatic in nature. Aliphatic halogenated compounds wherein the functional group is separated from the halogen by no more than two carbon atoms are preferred, with chlorinated compounds particularly preferred.

Illustrative of the water compatible halogenated compounds which may be used, in accordance with this invention, include among others butylchloral; chloroacetaldehyde; chloroacetone; chloroacetic acid; chlorobutanol; chlorohydrin, chloroproprionic acid; dichloroacetone; dichloroacetic acid; dichloroethyl formal; dichlorotetrafluoroacetone; ethylene chlorohydrin; dichloropropanol; trichloroacetaldehyde; trichloroacetic acid; trichloroethanol; trichlorofluoroacetone; bromoacetic acid; fluoroacetic acid; difluoroacetic acid; trifluoroacetic acid; iodoacetic acid; tribromoacetic acid; 1,3 difluoro-2-propanol; the alkali metal salts of halogenated phenols and the like. Dichloropropanol; glycerol chlorohydrin; dichloroacetone; trichloroacetic acid; dichloroacetic acid and the sodium salt of orthochlorophenol are preferred with dichloropropanol because of its favorable physical properties being particularly preferred.

In general, the halogenated compound concentration in water will vary depending on solubility and activity towards the polymer surface. Concentration ranges will be from about 5 to about 70% by weight, although it is desired to use as little of halogenated compounds as required to minimize losses due to "drag-out" and evaporation. For dichloropropanol, the preferred concentration is from about 10 to about 20% by weight.

The selected halogenated compound may be mixed with one or more mutually compatible halogenated compounds in the aqueous media which may contain surfactants, such as non-ionic wetting agents to promote contact with and wetting of the polymeric substrate. The halogenated compound may be introduced as such, as a salt or as hydrolyzable derivatives.

In use, the pre-etch compositions of this invention are employed at temperatures from about 80° F. to the melting point of a polymeric substrate. The preferred range is from about 100° to about 160° F.

Residence time will vary depending, on the polymeric substrate, to achieve a desired degree of surface modification to enhance bond strength. Residence time will, in general, range from about 0.5 to about 10 minutes, preferably from about 1 to about 3 minutes.

After conditioning the surface of a polymeric substrate with the pre-etch compositions in accordance with the practice of this invention, the substrate may then be simply rinsed to remove "drag-out" and passed directly to an inorganic etch, i.e. a strong base or oxidizing acid, and then on to a conventional electroless plating operation. An acid etch is suitable for most polymers, although a base may be required for other such as polyesters.

Preferably, however, precautions are taken to assure complete cleansing to optimize bond strengths. The substrates to be treated for electroless plating may be, for instance, washed in an alkaline cleanser to remove any grease or oil on the surface of the substrate. Residence time is short, generally only from about 1 to 2 minutes. The surface may also be cleaned and rendered hydrophilic by immersion in an oxidizing medium such as chromic acid-sulfuric acid mixture from 1 to 3 minutes.

After conditioning, the article is generally rinsed in water, preferably de-ionized water, and passed on to the inorganic etch. While any of the known oxidizing acid or base solutions may be employed as the etch, it is preferred to use, for polymers affected by acids, a pure chromic acid etch as described in U.S. Pat. No. 3,668,130 issued to two of us. The chromic acid etch used contains from about 8.5 to about 10.5 lbs of chromic acid per gallon of solution, which is above the normal solubility of chromic acid in water. Higher solubility is achieved by the presence of trivalent chromium formed in the reduction of the hexavalent chromium. An initial solution of high chromic acid content may be conveniently obtained by the addition of oxalic acid to a chromic acid solution to form trivalent chromium ions followed by the addition of chromium trioxide to the resultant solution to form an oxidizing acid of the desired hexavalent chromium assay. The etch with the oxidizing acid is generally at a temperature from about 110° F. to distortion temperature of the polymeric substrate preferably from about 110° to about 160° F., and more preferably from about 140° to about 150° F. Residence times ranging from about 5 to about 10 minutes, depending upon the nature of the substrate treated, are generally employed.

Following etching, there may be one or more rinses in water and then a final cleansing with a mild alkaline cleanser, generally maintained at temperatures from about 110° to about 130° F. and the residence time of the article is from about 3 to about 5 minutes.

After final cleansing, the article may now be passed on to any of the electroless plating operations, employing either copper or nickel. Conveniently, the substrate may be immersed in a solution of stannous chloride-hydrochloric acid to sensitize the plastic surface by absorption of stannous ions. This is generally followed by immersion in a solution of a noble metal salt, e.g. palladium chloride, to activate the substrate by reaction resulting in the reduction of the noble metal ions to the metal. The noble metal film on the substrate then acts as a catalyst in the electroless metal bath into which the activated substrate is passed.

A variety of electroless copper and nickel formulations may be used. For example, electroless copper formulations essentially consist of a soluble cupric salt, such as copper sulfate; a complexing agent for the cupric ion, such as Rochelle salt; and alkali hydroxide for adjustment of pH; a carbonate radical as a buffer; and a reducing agent for the cupric ion, such as formaldehyde. The mechanism by which objects having catalyzed surfaces, for example, an ABS article having catalytic palladium metal in its surface, as previously discussed, is plated auto-catalytically in such solutions, has been explained in the literature, for example, U.S. Pat. No. 2,874,072, issued Feb. 17, 1959.

Following electroless plating the substrate may be electrolytically plated by conventional means with copper, nickel, gold, silver, chromium and the like to provide the desired finish on the article. In such operations ultimate adhesive strength is dependent, in part, on metal to metal bond strength.

Besides the essential features of inducing adhesion to polysulfone, polycarbonate and polyesters and improving adhesion of an electrolessly deposited metal to other polymeric substrates, several advantages are offered by the practice of the process of this invention. Water is a low cost diluent which aids in draining the carried aliphatic halogenated compound from the surface of the substrate once it is withdrawn from the pre-etch bath. The amount carried out as "drag-out" is, therefore, reduced. Even as to the amount lost, only a small percentage of "drag-out" is the pre-etch compound, the balance being essentially water. This materially reduces loss of the aliphatic halogenated compounds many of which are expensive. Further, using water as the diluent makes the composition fully compatible with the aqueous rinse and etch operations which would not be the case if an organic diluent were employed. Water also makes the pre-etch system compatible with the total electroless plating operation which is aqueous based as well as an electrolytic plating operation. As an inert diluent is diminishes inhalation hazards and problems of ventilation.

In sum, the pre-etch compositions of this invention as compared to undiluted or hydrocarbon diluted chlorinated compounds reduce costs, hazards and offer a bath more fully compatible with plating operations. These results cannot be realized through the use of emulsions which are susceptible to breakdown from impurities "dragged-in".

EXAMPLES AND CONTROLS

While no wise limiting, the following are illustrative examples of the practice of this invention. In all instances where comparisons were made, the substrates were molded from identical resins under identical conditions to eliminate the known parameters associated with resin differences and the molding techniques. Peel strengths were determined by pulling a one-inch wide strip of metal from the plastic at an angle of 90° using a Dillon pull test apparatus.

In the Examples the polymeric substrate was immersed in an aqueous solution containing the identified water compatible halogenated compounds at the concentration shown. Immersion time and solution temperature is given. This constitutes pre-etch. The substrates were then rinsed and immersed in an etch which was a chromic acid solution containing from about 8.5 to 10.5 lbs of chromic acid per gallon of solution or a 33% caustic solution. This constitutes etch. For the Controls, the pre-etch step was omitted. Following treatment, the surface of the substrate was made catalytic to a conventional electroless copper solution by immersion in a solution containing stannous chloride and palladium chloride. The substrate was then immersed in the autocatalytic electroless copper solution containing a chelating agent for cupric ion, a pH regulator and a reducing agent for cupric ion. After a thin copper coat appeared on the substrate, the substrate was electroplated to a thickness of about 4 mils. Adhesion values were then determined by the peel test.

EXAMPLES 1 TO 4 AND CONTROL A

There was employed substrates molded from Udel TM 6050, a filled polysulfone manufactured and sold by Union Carbide Corporation containing about 10% by weight asbestos and about 2 to 3% by weight ZnO and $TiO_2$ based on the total weight of the resin and filler. The halogenated compound was dichloropropanol (1,3, dichloro-2-propanol) or DCP. The results are shown in Table I.

Table I

| Ex. or Control | Pre-Etch DCP Conc. % by vol. | T, °F | t,sec | Etch T°,F | t,min | Peel Strength Ranges lbs/in |
|---|---|---|---|---|---|---|
| 1 | 11 | 142 | 90 | 150 | 7.5 | 2–2.125 |
| 2 | 11 | 135 | 60 | 150 | 3.0 | 1.75–2 |
| 3 | 12.28 | 139 | 60 | 138 | 3.0 | 2.5–4 |
| 4 | 12.28 | 140 | 60 | 135 | 6.0 | 2.5–2.75 |
| A | — | — | — | 150 | 7.5 | 0 |

EXAMPLES 5 TO 8

There was employed as the substrate a plating grade of acrylonitrile-butadiene-styrene resin. The pre-etch was dichloropropanol at a concentration of 7.13% by volume.

While a Control gave a bond strength of 9 lbs, Table II shows the adhesion values for various temperatures and immersion times. The acid etch solution was maintained at 150° F.

Table II

| Ex. | T, °F | t,sec | Peel Strength lbs/in |
|---|---|---|---|
| 5 | 82 | 90 | 11.2 |
| 6 | 85 | 90 | 16.51 |
| 7 | 92 | 90 | 19.26 |
| 8 | 104 | 60 | 11.2 |

EXAMPLES 9 AND 10

In the following Examples and Control there was used as the substrate an ABS resin known as EP-3510 manufactured and sold by The Marbo Division of Borg-Warner Corporation. A 6% by volume solution of dichloropropanol was used as the pre-etch solution. Etch in the acid etch following pre-etch and for the control was in acid etch maintained at 150° F. The control gave a value of 11.2 lbs/in. The results obtained when the pre-etch was employed is shown in Table III.

Table III

| Ex. | T,°F | t,sec | Adhesion lbs/in |
|---|---|---|---|
| 9 | 107 | 60 | 12.6 |
| 10 | 107 | 90 | 21.9 |

EXAMPLES 11–14 AND CONTROLS B–E

Using EP-3510 as the polymeric substrate, there was employed as the halogenated compound, dichloroacetone (DCA). Because of variations in molding techniques, a control was used in each test. The results are shown in Table IV.

Table IV

| Ex. or Control | DCA Conc. % by Vol. | T,° F | t,sec | Peel Strength lbs/in |
|---|---|---|---|---|
| 11 | 17 | 100 | 60 | 18 |
| B | — | — | — | 9 |
| 12 | 12 | 106 | 60 | 15 |
| C | — | — | — | 11 |
| 13 | 12 | 114 | 60 | 17.5 |
| D | — | — | — | 10.5 |
| 14 | 12 | 117 | 90 | 26 |
| E | — | — | — | 9 |

EXAMPLES 15 TO 17

Using EP-3510 there was employed a solution of dichloroacetic acid in a concentration of 25% by volume. Peel strengths against a control of 6.5 lbs/in are shown in Table V.

Table V

| Ex. | T,° F | t,sec | Peel Strength lbs/in |
|---|---|---|---|
| 15 | 100 | 65 | 16.5 |
| 16 | 110 | 65 | 13 |
| 17 | 110 | 90 | 16 |

EXAMPLES 18 TO 20

Using EP-3510 there was again employed a solution of trichloroacetic acid in a concentration of 25% by volume. After etching, the articles were water rinsed and etched in the chromic acid bath maintained at 147° F. for 7 minutes. Peel strengths against a control of 8.5 lbs/in are shown in Table VI.

Table IV

| Ex. | T,° F | t,sec | Peel Strength lbs/in |
|---|---|---|---|
| 18 | 144 | 30 | 12.5 |
| 19 | 139 | 60 | 12.5 |
| 20 | 140 | 90 | 14.5 |

EXAMPLES 21 TO 24 AND CONTROL F

Except for Control F, glass filled polyester resin articles were pre-etched in aqueous solutions of dichloroacetic acid for the times and at the solution temperatures shown in Table VII. The pre-etched articles as well as the controls were then etched in a 33% aqueous solution of sodium hydroxide. Following neutralization of the base and rinsing, the articles were evaluated for degree of surface coating. The articles from Examples 23 and 24 were electroplated and placed through a thermal cycle test during which temperatures ranged from −30° to 180° F. No plate blistering occurred. The etch and pre-etch conditions as well as applicable remarks are shown in Table VII.

TABLE VII

| | Pre-Etch Dichloroacetic Acid Concentration % by Volume | T,° F | t,min | Etch T,° F | T,min | % Coverage by Electroless Copper Plate |
|---|---|---|---|---|---|---|
| Example 21 | 50 | 130 | 3 | 156 | 15 | 95 |
| Example 22 | 55 | 140 | 3 | 150 | 12 | 100 |
| Example 23 | 60 | 141 | 5 | 154 | 12 | 100 |
| Example 24 | 60 | 139 | 6 | 152 | 12 | 100 |
| Control F | — | — | — | 160 | 10.5 | Blistered |

EXAMPLES 25 TO 33

Dichloropropanol (DCP) was evaluated for its ability to improve the bond strength of an electroless deposited copper on glass filled polycarbonate resins. The procedure followed was to cleanse each article in a hydrolyzer solution, rinse the article in water, pre-etch in the dichloropropanol solution as shown in Table VIII, rinse in water, etch for 7 minutes the chromic acid bath maintained at 150° F., water rinse, neutralize acid and water rinse again. Following the final rinse the articles were catalyzed and electrolessly plated with copper. The results are shown in Table VIII.

In the control, (etch only), the plate blistered in the electroless plating solution.

EXAMPLE 34

Using the polysulfone of Examples 1 to 4 and Control A, there was used as the pre-etch an aqueous solution of the sodium salt of ortho-chlorophenol. Concentration was 5.5 grams/100 cc. Residence time was 1.5 minutes at 150° F. The article was rinsed and etched in the chromic acid etch for 4.5 minutes at 150° F. Peel strength was 1.0 lb/in.

EXAMPLE 35

A polycarbonate containing 15% by weight glass fibers was pre-etched with a 14% by volume solution of dichloropropanol in water. Solution temperature was 148° F. and residence time was 2.5 minutes. After rinsing, the pre-etched substrate was then etched for 10 minutes in the caustic bath maintained at 160° F. Adhesion was 1.8 lb/in. In a control, with etch only in the caustic for 20 minutes, peel strength was zero.

TABLE VIII

| | Volume % | DCP T,° F | t,min | Adhesion, lb/in 10% Glass Filled | 15% Glass Filled |
|---|---|---|---|---|---|
| Example 25 | 13.6 | 150 | 2.0 | 1 | 1.75 |
| Example 26 | 13.6 | 148 | 2.5 | 5 | 1.5 |
| Example 27 | 13.6 | 149 | 3.0 | 7 | 1.5 |
| Example 28 | 14.2 | 154 | 1.5 | None | 0.75 |
| Example 29 | 14.2 | 152 | 2.0 | 2 | 1.25 |
| Example 30 | 14.2 | 152 | 2.5 | 2.5 | 1.75 |
| Example 31 | 14.5 | 153 | 1.5 | None | 1.25 |
| Example 32 | 14.5 | 152 | 2.0 | 4.5 | 2.0 |
| Example 33 | 14.5 | 152 | 2.5 | 4.75 | 1.5 |

What is claimed is:

1. In a process for electroless plating of a polymeric substrate with a metal which includes the step of contacting the surface of the substrate with an inorganic etch prior to electroless plating, the improvement which comprises contacting, prior to contact with the inorganic etch, a polymeric substrate selected from the group consisting of polysulfones and polycarbonates with an aqueous solution of a water compatible halogenated compound containing from 1 to about 6 carbon atoms and a functional group selected from

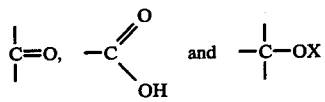

wherein X is hydrogen or an alkali metal and in which a halide is separated from the functional group by no more than three carbon atoms at a temperature and for a time sufficient to modify the surface of the polymeric substrate to at least induce adhesion of the electroless plate thereto.

2. A process as claimed in claim 1 in which the water compatible halogenated compound content of the aqueous solution is from about 5 to about 70% by weight.

3. A process as claimed in claim 1 in which the aqueous solution is maintained at a temperature from about 80° to about 160° F.

4. A process as claimed in claim 1 in which contact time is from about 0.5 to about 10 minutes.

5. A process as claimed in claim 1 in which the halogenated compound is an aliphatic chlorinated compound containing at least two chlorine atoms, wherein at least one of the chlorine atoms is separated from the functional group by no more than two carbon atoms.

6. A process as claimed in claim 2 in which the halogenated compound is an aliphatic chlorinated compound containing at least two chlorine atoms, wherein at least one of the chlorine atoms is separated from the functional group by no more than two carbon atoms.

7. A process as claimed in claim 1 in which the halogenated compound is a chlorinated compound selected from the group consisting of dichloropropanol, dichloroacetone, dichloroacetic acid, trichloroacetic acid, the sodium salt of ortho-chlorophenol and mixtures thereof.

8. A process as claimed in claim 1 in which the polymeric substrate is a filled polysulfone.

9. In a process for electroless plating of polysulfone substrates with a metal which includes the step of contacting the surface of the substrate with an inorganic etch prior to electroless plating, the improvement which comprises contacting the polysulfone substrate, prior to contact with the inorganic etch, with an aqueous solution of at least one water compatible halogenated compound containing from about 1 to about 6 carbon atoms and a functional group selected from

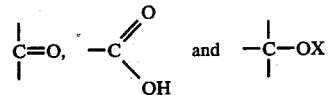

wherein X is hydrogen or an alkali metal and in which a halogen is separated from the functional group by no more than three carbon atoms at a solution temperature from about 130° to about 160° F. for a time sufficient to induce adhesion of the electroless plate of metal thereto.

10. A process as claimed in claim 9 in which the halogenated compound is an aliphatic chlorinated compound containing at least two chlorine atoms, wherein one of the chlorine atoms is separated from the functional group by no more than two carbon atoms.

11. A process as claimed in claim 9 in which the halogenated compound content of the aqueous solution is from about 5 to about 70% by weight.

12. A process as claimed in claim 9 in which the halogenated compound is dichloropropanol.

13. A process as claimed in claim 12 in which the dichloropropanol is present in a concentration of from about 10 to 20% by weight.

14. A process as claimed in claim 9 in which the halogenated compound is a chlorinated compound selected from the group consisting of dichloroacetone, dichloroacetic acid, trichloroacetic acid, the sodium salt of ortho-chlorophenol and mixtures thereof.

15. A process as claimed in claim 9 in which contact time is from about 0.5 to about 10 minutes.

16. A process as claimed in claim 9 in which contact time is from about 1 to about 3 minutes.

17. A process as claimed in claim 9 in which solution temperature is from about 130° to about 150° F.

18. A process as claimed in claim 9 in which the polysulfone is a filled polysulfone.

* * * * *

UNITED STATES PATENT AND TRADEMARK OFFICE
CERTIFICATE OF CORRECTION

PATENT NO. : 4,125,649

DATED : November 14, 1978

INVENTOR(S) : LAWRENCE P. DONOVAN, EILEEN MAGUIRE, LEON A. KADISON

It is certified that error appears in the above-identified patent and that said Letters Patent are hereby corrected as shown below:

```
     Column 5, line 40, for "is" read -- it --.
Column 6, line 56, for "Marbo" read -- Marbon --.  Column 10,
line 2, insert after the word etch -- etc., --.
```

Signed and Sealed this

Seventeenth Day of April 1979

[SEAL]

Attest:

RUTH C. MASON
*Attesting Officer*

DONALD W. BANNER
*Commissioner of Patents and Trademarks*